(12) United States Patent
Kobayashi

(10) Patent No.: US 8,461,876 B2
(45) Date of Patent: Jun. 11, 2013

(54) SEMICONDUCTOR DEVICE

(75) Inventor: Atsushi Kobayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/473,826

(22) Filed: May 17, 2012

(65) Prior Publication Data

US 2012/0319733 A1 Dec. 20, 2012

(30) Foreign Application Priority Data

Jun. 15, 2011 (JP) ................... 2011-133585

(51) Int. Cl.
*H02H 7/122* (2006.01)
*H02M 7/00* (2006.01)

(52) U.S. Cl.
USPC ........... 326/120; 315/291; 363/56.01

(58) Field of Classification Search
USPC ..... 326/120, 83; 315/291, 307, 297; 363/123, 363/16, 56.01, 131
See application file for complete search history.

(56) References Cited

U.S. PATENT DOCUMENTS

| 6,486,618 B1 * | 11/2002 | Li ................. | 315/291 |
| 2003/0107905 A1 | 6/2003 | Miura et al. | |
| 2006/0198173 A1 * | 9/2006 | Rozman ........... | 363/123 |

FOREIGN PATENT DOCUMENTS

JP   A-2000-114550   4/2000

OTHER PUBLICATIONS

Mochikawa et al., "Innovative Circuit Technology for More compact and Effective Inverters," *Toshiba Review*, vol. 61 No. 11, pp. 32-35, 2006 (Discussed on pp. 1-2 in the specification).

* cited by examiner

*Primary Examiner* — Daniel D Chang
(74) *Attorney, Agent, or Firm* — Posz Law Group, PLC

(57) ABSTRACT

A semiconductor device includes two unit circuits and a control unit. A middle point between the unit circuits is coupled with an inductive load. Each unit circuit includes a first switching element and a free wheel diode coupled in inverse-parallel with the first switching element. At least one of the unit circuits further includes a bypass section coupled in parallel with the first switching element and the free wheel diode. The bypass section includes a second switching element and a resistor coupled in series. The controller alternately turns on the first switching elements with a dead time during which both the first switching elements are turned off. The controller controls the second switching element coupled in parallel with one of the first switching elements to be an on-state when the one of the first switching elements transitions from an off-state to an on-state in the dead time.

9 Claims, 9 Drawing Sheets

SEMICONDUCTOR DEVICE

CROSS REFERENCE TO RELATED APPLICATIONS

The present application is based on and claims priority to Japanese Patent Applications No. 2011-133585 filed on Jun. 15, 2011 and No. 2012-36551 filed on Feb. 22, 2012, the contents of which are incorporated in their entirety herein by reference.

TECHNICAL FIELD

The present disclosure relates to a semiconductor device including two unit circuits coupled in series between a direct current power supply and a ground.

BACKGROUND

Conventionally, an inverter that includes two metal-oxide semiconductor field-effect transistors (MOSFETs) coupled in series between a direct current (DC) power supply and a ground is known, for example, as disclosed in TOSHIBA REVIEW, Vol. 61, No. 11, p. 32 (2006) (hereafter, referred to as Nonpatent Document No. 1). To a middle point between the two MOSFETs, an inductive load is coupled. The MOSFETs include parasitic diodes. Thus, in the inverter, two switching elements are coupled in series between the DC power supply and the ground, and the parasitic diodes are coupled in inverse-parallel with the switching elements, respectively. The inverter alternately turns on the two switching elements (MOSFETs) with a dead time during which both the two switching elements are turned off.

In cases where electric current flows into the inductive load and electric current flows into the parasitic diode in the dead time, carries are stored in the parasitic diode into which the electric current flows. When the other switching elements is turned on from the above-described state, a recovery current flows to the parasitic diode and ringing occurs in voltage between both ends of the parasitic diode. The ringing is a LC resonance depending on a capacitance of the parasitic diode and a parasitic inductive load of the inverter. A magnitude of the ringing depends on the carriers stored in the parasitic diode.

In order to restrict generation of the ringing, the inverter disclosed in the Nonpatent Document No. 1 includes recovery assist circuits coupled in parallel with the MOSFET. The recovery assist circuit includes a recovery assist switch circuit and a recovery assist auxiliary power supply coupled in series. In the dead time, when the recovery assist switch circuit is turned on, a voltage of the recovery assist auxiliary power supply is applied to the parasitic diode in the reverse direction. Accordingly, storage of the carriers is restricted, and the ringing is restricted.

As described above, the inverter disclosed in the Nonpatent Document No. 1 includes the recovery assist circuit coupled in parallel with the MOSFET, and the recovery assist circuit includes the recovery assist auxiliary power supply. Because the recovery assist auxiliary power supply is used in addition to the DC power supply, a dimension and a cost of the inverter increase.

SUMMARY

It is an object of the present disclosure to provide a semiconductor device that can restrict increase in a dimension and a cost.

A semiconductor device according to a first aspect of the present disclosure includes a first unit circuit, a second unit circuit, and a controller. The first unit circuit and a second unit circuit are coupled in series between a direct current power supply and a ground. A middle point between the first unit circuit and the second unit circuit is coupled with an end of an inductive load. Each of the unit circuits includes a first switching element and a free wheel diode that is coupled in inverse-parallel with the first switching element. At least one of the unit circuits includes a bypass section coupled in parallel with each of the free wheel diode and the first switching element. The bypass section includes a second switching element and a resistor coupled in series. The controller alternately turns on the first switching element of the first unit circuit and the first switching element of the second unit circuit with a dead time during which both the first switching elements are turned off for a predetermined time. The controller controls the second switching element coupled in parallel with one of the first switching elements to be an on-state when the one of the first switching elements transitions from an off-state to an on-state in the dead time.

The semiconductor device according to the first aspect can restrict increase in a dimension and a cost compared with a case where an auxiliary circuit including an auxiliary power supply and an auxiliary switch are coupled in parallel with the first switching element and the free wheel diode.

A semiconductor device according to a second aspect of the present disclosure includes two unit circuits and a controller. The unit circuits are coupled in series between a direct current power supply and a ground. A middle point between the unit circuits is coupled with an end of an inductive load. One of the unit circuits includes a first switching element, a free wheel diode that is coupled in inverse-parallel with the first switching element, and a bypass section coupled in parallel with each of the free wheel diode and the first switching element. The bypass section includes a second switching element and a resistor coupled in series. The other of the unit circuits includes a diode that is reversely coupled between the direct current power supply and the ground. The controller that controls the second switching element to be an on-state when the first switching element transitions from an off-state to an on-state.

The semiconductor device according to the second aspect can restrict increase in a dimension and a cost compared with a case where an auxiliary circuit including an auxiliary power supply and an auxiliary switch are coupled in parallel with the first switching element and the free wheel diode.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

In the following embodiments, as an example, a semiconductor device according to the present disclosure is applied to an inverter that converts a direct current voltage (DC voltage) to an alternating current voltage (AC voltage).

(First Embodiment)

An inverter 100 according to a first embodiment of the present disclosure will be described with reference to FIG. 1 to FIG. 7C.

Figure 1:
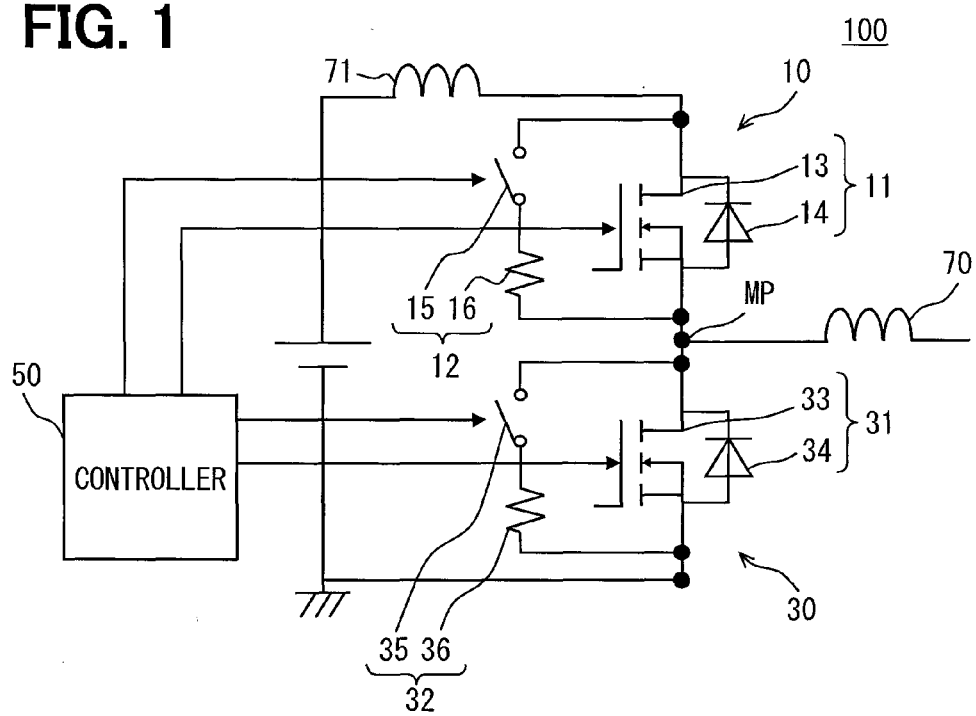
FIG. 1 is a circuit diagram showing an inverter according to a first embodiment of the present disclosure.

As shown in FIG. 1, the inverter 100 includes a high-side unit circuit 10, a low-side unit circuit 30, and a controller 50 that controls the high-side unit circuit 10 and the low-side unit circuit 30. The high-side unit circuit 10 and the low-side unit circuit 30 are coupled in series between a DC power supply and a ground. A middle point MP between the high-side unit circuit 10 and the low-side unit circuit 30 is coupled with end of an inductive load 70. A voltage that is converted from a DC voltage to an AC voltage by the inverter 100 is output to the inductive load 70. The controller 50 alternately turns on two first switching elements 13, 33 with a dead time DT during which both the first switching elements 13, 33 are turned off for a predetermined period, thereby converting the DC voltage to the AC voltage. An inductive load 71 coupled between the DC power supply and the high-side unit circuit 10 is a parasitic inductive load of the inverter 100. The high-side unit circuit 10 can operate as a first unit circuit, and the low-side unit circuit 30 can operate as a second unit circuit.

As shown in FIG. 1, the high-side unit circuit 10 is located on a DC power supply side and the low-side unit circuit 30 is located on a ground side.

The high-side unit circuit 10 includes a high-side MOSFET 11 and a high-side bypass section 12. The high-side MOSFET 11 includes a high-side first switching element 13 and a high-side free wheel diode 14. The high-side first switching element 13 can operate as a switch. The high-side free wheel diode 14 is coupled in inverse-parallel with the high-side first switching element 13. The high-side bypass section 12 is coupled in parallel with the high-side MOSFET 11. The high-side bypass section 12 includes a set of a high-side second switching element 15 and a high-side resistor 16 coupled in series between both ends of the high-side MOSFET 11. The high-side free wheel diode 14 is a parasitic diode of the high-side MOSFET 11.

The low-side unit circuit 30 includes a low-side MOSFET 31 and a low-side bypass section 32. The low-side MOSFET 31 includes a low-side first switching element 33 and a low-side free wheel diode 34. The low-side first switching element 33 can operate as a switch. The low-side free wheel diode 34 is coupled in inverse-parallel with the low-side first switching element 33. The low-side bypass section 32 is coupled in parallel with the low-side MOSFET 31. The low-side bypass section 32 includes a set of low-side second switching element 35 and a low-side resistor 36 coupled in series between both ends of the low-side MOSFET 31. The low-side free wheel diode 34 is a parasitic diode of the low-side MOSFET 31.

The MOSFETs 11, 31 are N-channel type MOSFETs. Each of the first switching elements 13, 33 becomes an on-state on receiving a signal at a high voltage level (hereafter, referred to as a high signal) and becomes an off-state on receiving a signal at a low voltage level (hereafter, referred to as a low signal). Each of the second switching elements 15, 35 also becomes an on-state on receiving a high signal and becomes an off-state on receiving a low signal.

Figure 2:
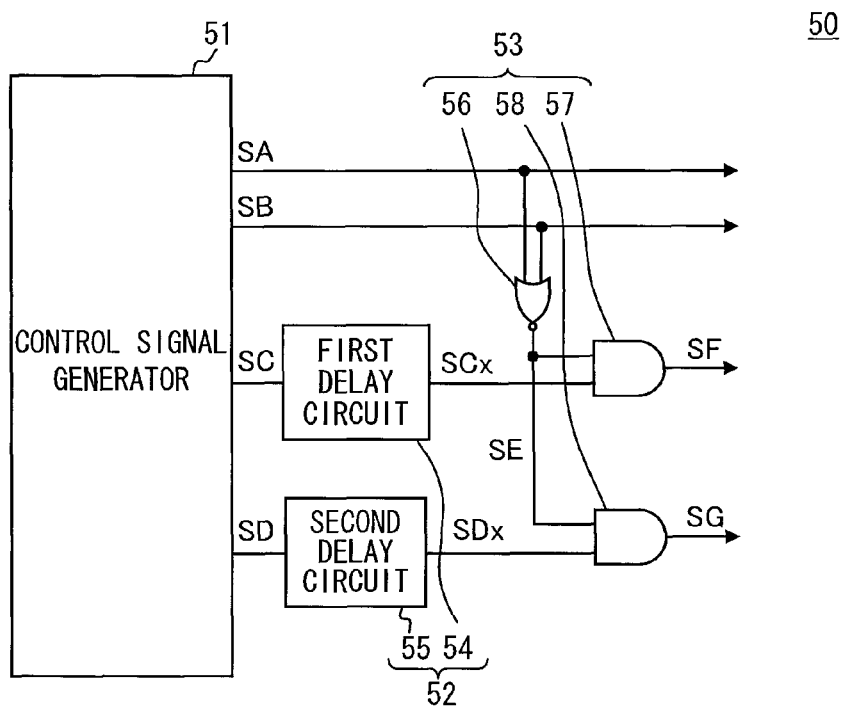
FIG. 2 is a diagram showing a controller in the inverter according to the first embodiment.

The controller 50 alternately turns of the first switching elements 13, 33 with the dead time DT. In the dead time, the controller 50 controls the high-side second switching element 15 to be in an on-state when the high-side first switching element 13 transitions from the off-state to the on-state. In the dead time, the controller 50 also controls the low-side second switching element 35 to be in an on-state when the low-side first switching element 33 transitions from the off-state to the on-state. As shown in FIG. 2, the controller 50 includes a control signal generator 51, a delay circuit 52, and a logic gate 53. The control signal generator 51 generates control signals SA-SD whose voltage levels are periodically changed between the high level and the low level. The delay circuit 52 delays the control signal SC, SD. The logic gate 53 changes a voltage level of an output signal in accordance with a voltage level of a signal input to the logic gate 53.

The control signal generator 51 generates a first control signal SA, a second control signal SB, a third control signal SC, and a fourth control signal SD. A voltage level of the second control signal SB is opposite from a voltage level of the first control signal SA except for the dead time DT. The third control signal SC is at the high level from a falling edge of the second control signal SB to a rising edge of the first control signal SA in a first dead time DT1. The fourth control signal SD is at the high level during from a falling edge of the first control signal SA to a rising edge of the second control signal SB in a second dead time DT2. The first control signal SA is input to the high-side first switching element 13, and the second control signal SB is input to the low-side first switching element 33. The control signals SA, SB have the same duty ratio and the same frequency. The first dead time DT1 and the second dead time DT2 have the same length of time.

The delay circuit 52 includes a first delay circuit 54 and a second delay circuit 55. The first delay circuit 54 receives the third control signal SC and outputs a third control signal SCx that is delayed for a time shorter than the first dead time DT1. In the present embodiment, the first delay circuit 54 transmits delays the third control signal SCx for a half time of the first dead time DT1 . The second delay circuit 55 receives the fourth control signal SD and outputs a fourth control signal SDx that is delayed for a time shorter than the second dead time DT2. In the present embodiment, the second delay circuit 55 delays the fourth control signal SDx for a half time of the second dead time DT2.

The logic gate 53 includes a NOR gate 56, a first AND gate 57, and a second AND gate 58. The NOR gate 56 outputs a high signal when two input signals are low level. The first AND gate 57 and the second AND gate 58 output high signals when two input signals are high level. The NOR gate 56 receives the first control signal SA and the second control signal SB. The first AND gate 57 receives an output signal SE of the NOR gate 56 and the third control signal SCx via the first delay circuit 54. The second AND gate 58 receives the output signal SE of the NOR gate 56 and the fourth control signal SDx via the second delay circuit 55. An output signal SF of the first AND gate 57 is input to the high-side second switching element 15. An output signal SG of the second AND gate 58 is input to the low-side second switching element 35.

Next, an operation of the inverter 100 according to the present embodiment will be described with reference to FIG. 1 to FIG. 3. Hereafter, a start time of the first dead time DT1 is denoted by t1, a middle time of the first dead time DT1 is denoted by t2, an end time of the first dead time DT1 is denoted by t3, a start time of the second dead time DT2 is denoted by t4, a middle time of the second dead time DT2 is denoted by t5, and an end time of the second dead time DT2 is denoted by t6. A time from t1 to t2 is referred to as a first term, a time from t2 to t3 is referred to as a second term, a time from t3 to t4 is referred to as a third term, a time from t4 to t5 is referred to as a fourth term, and a time from t5 to t6 is referred to as fifth term, and a time from t6 to t1 is referred to as a sixth term. The first term, the second term, the fourth term, and the fifth term have the same length and correspond to the half of the dead times DT1, DT2.

Figure 3:
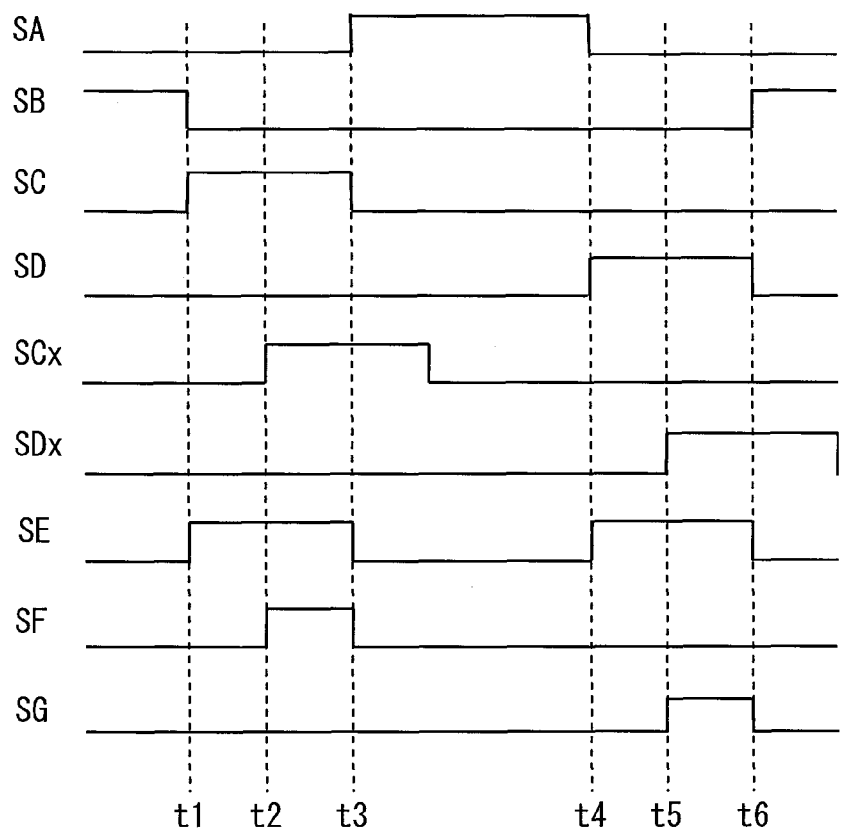
FIG. 3 is a timing diagram showing signals in the controller.

As shown in FIG. 3, during the first term, the first control signal SA and the second control signal SB are at the low level. Thus, both the first switching elements 13, 33 are in the off-state and the output signal SE of the NOR gate 56 is at the high level. The third control signal SC is at the high level and the fourth control signal SD is at the low level. Because the control signals SC, SD are at the low level except for the dead time, the control signals SCx, SDx output from the delay circuits 54, 55 are also at the low level. Accordingly, each of the AND gates 57, 58 receives the high signal and the low signal, and the output signals SF, SG of the AND gates 57, 58 are at the low level. Therefore, each of the second switching elements 15, 35 is in the off-state. In the first term, electric current flows into one of the free wheel diodes 14, 34, and electric current flows into the inductive load 70. Hereafter, the electric current that flows into the free wheel diodes 14, 34 is referred to as a backflow current, and the electric current that flows into the inductive load 70 is referred to as a load current.

During the second term, the first control signal SA and the second control signal SB are at the low level. Thus, each of the first switching elements 13, 33 is in the off-state, and the output signal SE of the NOR gate 56 is at the high level. The third control signal SC is at the high level and the fourth control signal SD is at the low level. However, because the third control signal SC is at the high level and the fourth control signal SD is at the low level during the first term, the output signal SCx of the first delay circuit 54 is at the high level, and the output signal SDx of the second delay circuit 55 is at the low level. Because the first AND gate 57 receives the two high signals, the output signal SF of the first AND gate 57 is at the high level. The second AND gate 58 receives the high signal and the low signal. Thus, the output signal SG of the second AND gate 58 is at the low level. Accordingly, the high-side second switching element 15 is in the on-state and the low-side second switching element 35 is in the off-state. During the second term, electric current flows in the high-side bypass section 12 toward the middle point MP in addition to the backflow current and the load current. Hereafter, electric current that flows in the bypass sections 12, 32 is referred to as a bypass current.

During the third term, the first control signal SA is at the high level and the second control signal SB is at the low level. Thus, the high-side first switching element 13 is in the on-state, the low-side first switching element 33 is in the off-state, and the output signal SE of the NOR gate 56 is at the low level. The output signal SE at the low level is input to the AND gates 57, 58. Because the AND gates 57, 58 are configured to output the high signal when two input signals are at the high level, the output signals SF, SG of the AND gates 57, 78 are at the low level. Thus, both of the second switching elements 15, 35 are in the off-state. During the third term, the load current flows into the inductive load 70, and electric current flows into the high-side first switching element 13. Reverse current may flow to one of the free wheel diodes 14, 34, and ringing may occur. Cases that the ringing occurs will be described later.

During the fourth term, the first control signal SA and the second control signal SB are at the low level. Thus, both of the first switching elements 13, 33 are in the off-state and the output signal SE of the NOR gate 56 is at the high level.

The third control signal SC is at the low level and the fourth control signal SD is at the high level. However, because the control signals SC, SD are at the low level except for the dead time, the output signals SCx, SDx of the delay circuits 54, 55 are at the low level. Accordingly, each of the AND gates 57, 58 receives the high signal and the low signal, and the output signals SF, SG of the AND gates 57, 58 are at the low level. Thus, both of the second switching elements 15, 35 are in the off-state. During the fourth term, the backflow current flows into one of the free wheel diodes 14, 34 and the load current flows into the inductive load 70.

During the fifth term, the first control signal SA and the second control signal SB are at the low level. Thus, both of the first switching elements 13, 33 are in the off-state and the output signal SE of the NOR gate 56 is at the high level. The third control signal SC is at the low level and the fourth control signal SD is at the high level. However, because the third control signal SC is at the low level and the fourth control signal SD is at the high level during the fourth term, the output signal SCx of the first delay circuit 52 is at the low level and the output signal SDx of the second delay circuit 55 is at the high level. The first AND gate 57 receives the high signal and the low signal. Thus, the output signal SF of the first AND gate 57 is at the low level. The second AND gate 58 receives the two high signals. Thus, the output signal SG of the second AND gate 58 is at the high level. Therefore, the high-side second switching element 15 is in the off-state and the low-side second switching element 35 is in the on-state. During the fifth term, a bypass current flows into the low-side bypass section 32 in a direction away from the middle point MP in addition to the backflow current and the load current.

During the sixth term, the first control signal SA is at the low level and the second control signal SB is at the high level. Thus, the high-side first switching element 13 is in the off-state, the low-side first switching element 33 is in the on-state, and the output signal SE of the NOR gate 56 is at the low level. The output signal SE at the low level is input to the AND gates 57, 58. Because the AND gates 57, 58 are configured to output the high signal when two input signals are at the high level, the output signals SF, SG of the AND gates 57, 78 are at the low level. Thus, both of the second switching elements 15, 35 are in the off-state. During the sixth term, the load current flows into the inductive load 70, and electric current flows into the low-side first switching element 33. Reverse current may flow to one of the free wheel diodes 14, 34, and ringing may occur. Cases that the ringing occurs will be described later.

Figure 4:
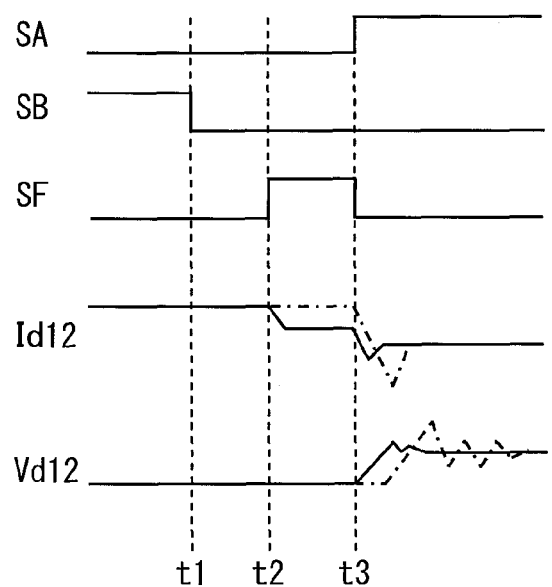
FIG. 4 is a timing diagram for explaining ringing of a low-side free wheel diode.

Next, generation of ringing and function effects of the inverter 100 according to the present embodiment will be described with reference to FIG. 4 to FIG. 7C. In FIG. 4 and FIG. 6, both-end voltages Vd11, Vd12 and backflow currents Id11, Id12 in cases where the inverter 100 does not include the bypass sections 12, 32 are shown by dashed-dotted lines. In FIG. 5A to FIG. 5C and FIG. 7A to FIG. 7C, electric currents that flow into the inverter 100 and the inductive load 70 are shown by dashed arrows.

Figure 5A:
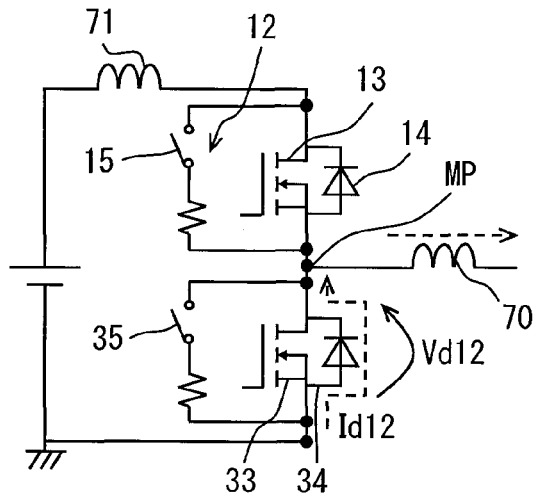
FIG. 5A is a diagram showing an electric current that flows in the inverter during a first term.
Figure 5B:
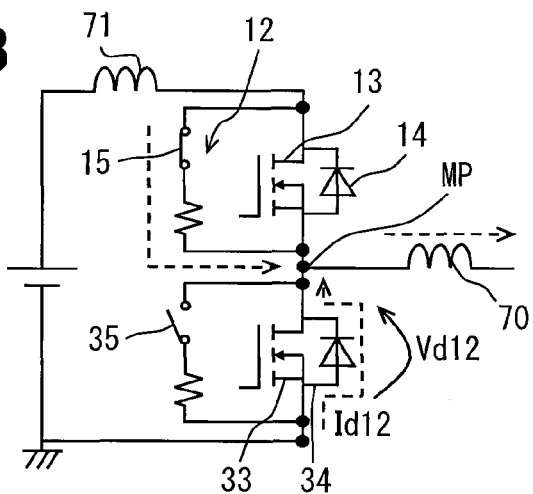
FIG. 5B is a diagram showing an electric current that flows in the inverter during a second term.
Figure 6:
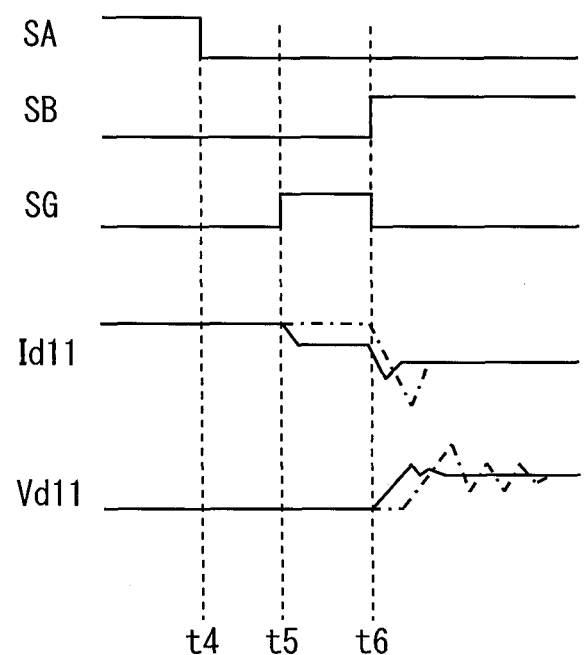
FIG. 6 is a timing diagram for explaining ringing of a high-side free wheel diode.

As shown in FIG. 5A, during the first term, when the load current flows into the inductive load 70 in the direction away from the middle point MP and the backflow current Id12 flows into the low-side free wheel diode 34 toward the middle point MP, the load current is equal to the backflow current Id12.

When it transitions from the first term to the second term and the high-side second switching element 15 is turned on, the bypass current flows into the high-side bypass section toward the middle point MP. In the present case, the load current is equal to the sum of the backflow current Id12 and the bypass current. Because the load current changes little, as a result of driving the high-side second switching element 15, the backflow current Id12 decreases by a current corresponding to the bypass current. Accordingly, storage of carriers in the low-side free wheel diode 34 can be restricted.

Figure 5C:
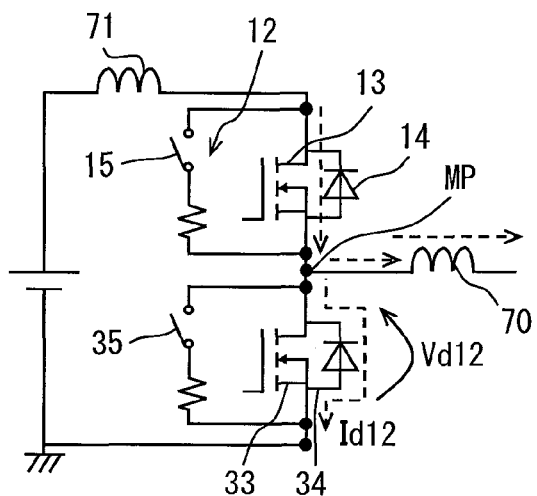
FIG. 5C is a diagram showing an electric current that flows in the inverter during a third term.

When it transitions from the second term to the third term, the high-side second switching element 15 is turned off, and the high-side first switching element 13 is turned on, as shown in FIG. 5C, the reverse current flows in the low-side free wheel diode 34, and ringing (LC resonance) occurs in the both-end voltage Vd12 and the backflow current Id12 due to the capacitance of the low-side free wheel diode 34 and the inductive load 71. However, because the storage of the carries in the low-side free wheel diode 34 is restricted during the second term, the ringing can be restricted.

Figure 7A:
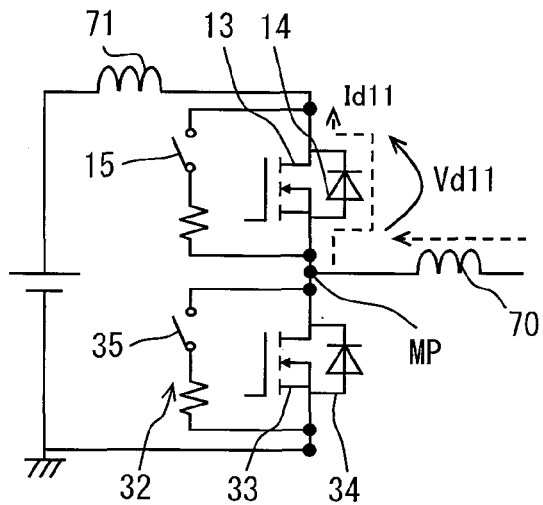
FIG. 7A is a diagram showing an electric current that flows in the inverter during a fourth term.

As shown in FIG. 7A, during the fourth term, when the load current flows into the inductive load 70 toward the middle point MP and the backflow current Id11 flows into the high-side free wheel diode 14 in the direction away from the middle point MP, the load current is equal to the backflow current Id11.

Figure 7B:
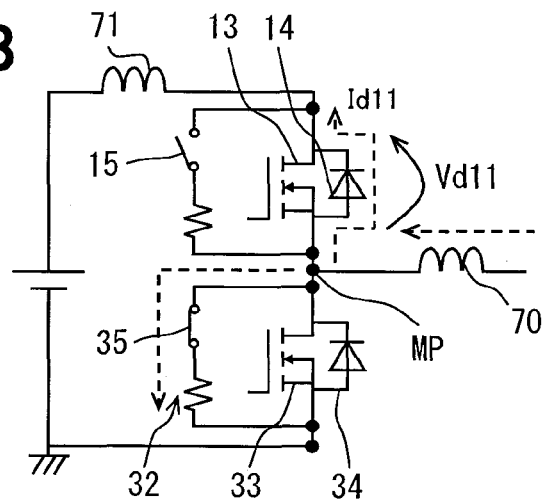
FIG. 7B is a diagram showing an electric current that flows in the inverter during a fifth term.

When it transitions from the fourth term to the fifth term and the low-side second switching element 35 is turned on, as shown in FIG. 7B, the bypass current flows into the low-side bypass section 32 in the direction away from the middle point MP. In the present case, the load current is equal to the sum of the backflow current Id11 and the bypass current. Because the load current changes little, as a result of driving the low-side second switching element 35, the backflow current Id11 decreases by a current corresponding to the bypass current. Accordingly, storage of the carriers in the high-side free wheel diode 14 can be restricted.

Figure 7C:
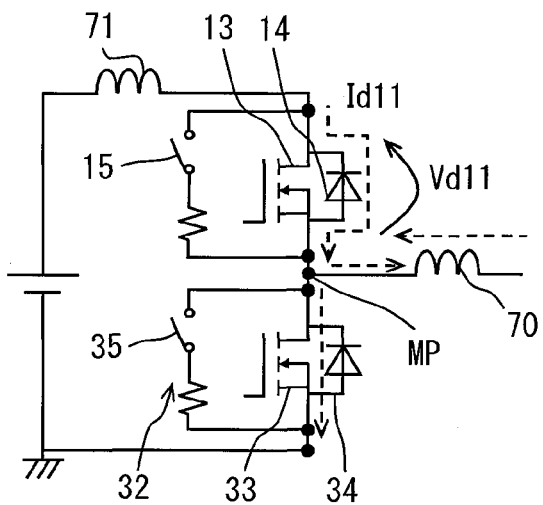
FIG. 7C is a diagram showing an electric current that flows in the inverter during a sixth term.

When it transitions from the fifth term to the sixth term, the low-side second switching element 35 is turned off, and the low-side first switching element 33 is turned on, as shown in FIG. 7C, the reverse current flows into the high-side free wheel diode 14, and ringing (LC resonance) occurs in the both-end voltage Vd11 and the backflow current Id1 due to the capacitance of the high-side free wheel diode 14 and the inductive load 71. However, because the storage of the carries in the high-side free wheel diode 14 is restricted during the fifth term, the ringing can be restricted.

As described above, in the inverter 100, the high-side bypass section 12 including the high-side second switching element 15 and the high-side resistor 16 is coupled in parallel with the high-side MOSFET 11, and the low-side bypass section 32 including the low-side second switching element 35 and the low-side resistor 36 is coupled in parallel with the low-side MOSFET 31. Accordingly, ringing can be restricted. Thus, compared with a case where auxiliary circuits each including an auxiliary power supply and an auxiliary switch are respectively coupled in parallel with two MOSFETs, increase in a dimension and a cost of the inverter 100 can be restricted.

(Second Embodiment)

An inverter 100 according to a second embodiment of the present disclosure will be described with reference to FIG. 8 and FIG. 9. In FIG. 9, parts of the control signal generator 51, the delay circuit 52, and the logic gate 53 are not shown for the sake of convenience.

Because the inverter 100 according to the present embodiment has many portions in common with the inverter 100 according to the first embodiment, a description of the common portions will be omitted and different portions will be mainly described. In the following description, the same reference numbers are given to components same as the components described in the first embodiment.

In the present embodiment, the high-side bypass section 12 includes three sets of the high-side second switching element 15 and the high-side resistor 16 coupled in series between both ends of the high-side MOSFET 11, and the low-side bypass section 32 includes three sets of the low-side second switching element 35 and the low-side resistor 36 coupled in series between both ends of the low-side MOSFET 31.

Figure 8:
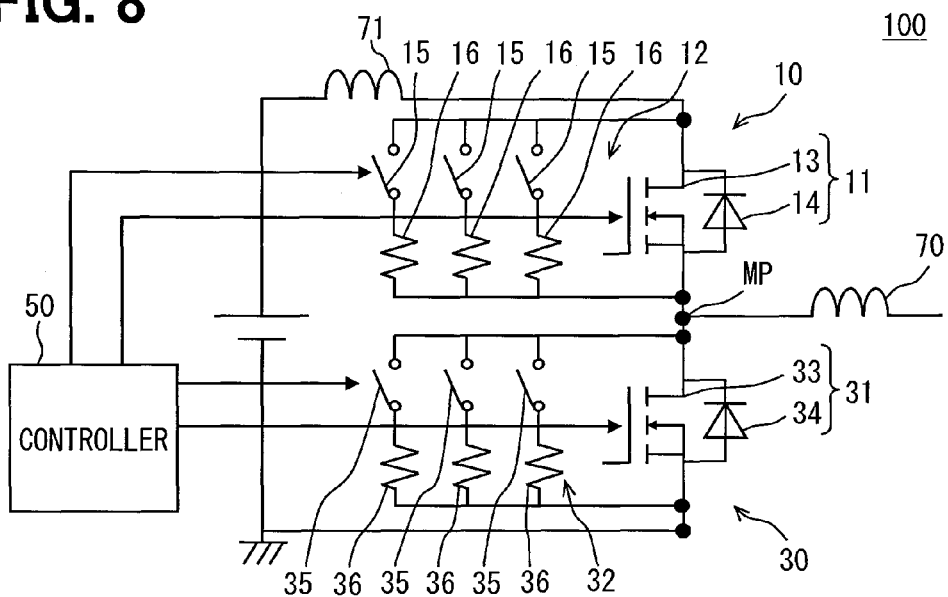
FIG. 8 is a circuit diagram showing an inverter according to a second embodiment of the present disclosure.
Figure 9:
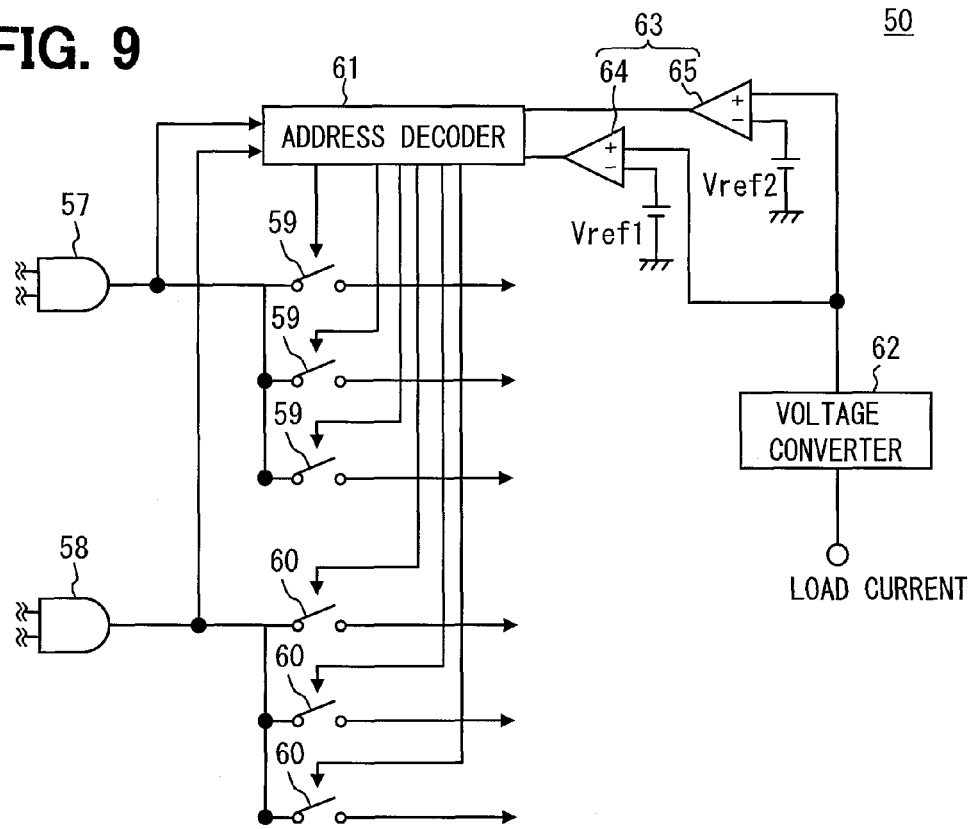
FIG. 9 is a diagram showing a controller in the inverter according to the second embodiment.

As shown in FIG. 8, each set of the high-side second switching element 15 and the high-side resistors 16 is coupled in parallel with the other sets between the both ends of the high-side MOSFETs 11, and each set of the low-side second switching element 35 and the low-side resistor 36 is coupled in parallel with other sets between the both ends of the low-side MOSFET 31. In the present embodiment, the high-side resistors 16 and the low-side resistors 36 have the same resistance value.

The controller 50 according to the present embodiment drives each of the bypass sections 12, 32 by turning on at least one of the three second switching elements 15, 35. As shown in FIG. 9, the controller 50 includes third switching elements 59, fourth switching elements 60, an address decoder 61, a voltage converter 62, and a comparator 63 in addition to the control signal generator 51, the delay circuit 52, and the logic gate 53. Each of the third switching elements 59 is coupled between the first AND gate 57 and a corresponding one of the high-side second switching elements 15 such that the three third switching elements 59 are coupled in parallel with each other between the first AND gate 57 and the high-side bypass section 12. Each of the fourth switching elements 60 is coupled between the second AND gate 58 and a corresponding one of the low-side second switching elements 35 such that the three fourth switching elements 60 are coupled in parallel with each other between the second AND gate 58 and the low-side bypass section 32.

An output signal (driving signal) of the address decoder 61 is input to each of the third switching elements 59 and each of the fourth switching elements 60. The address decoder 61 receives the output signals of the first AND gate 57, the second AND gate 58, and the comparator 63. On receiving the high signal from the first AND gate 57, the address decoder 61 outputs the driving signal to the third switching elements 59. On receiving the high signal from the second AND gate 58, the address decoder 61 outputs the driving signal to the fourth switching elements 60. The address decoder 61 selects the switching elements 59, 60 to which the address decoder 61 outputs the driving signal based on the output signal of the comparator 63.

The voltage converter 62 converts the load current into the voltage. The voltage converter 62 outputs a voltage in accordance with the current value of the load current. The converted voltage value depends on only the current value and does not depend on a flow direction of the load current.

The comparator 63 includes a first comparator 64 and a second comparator 65. The first comparator 64 compares the voltage converted by the voltage converter 62 (hereafter, referred to as a load voltage VI) with a first threshold voltage Vref1. The second comparator 65 compares the load voltage VI with the second threshold voltage Vref2. The first threshold voltage Vref1 is lower than the second threshold voltage Vref2. The load voltage VI is applied to inverting input terminals of the first comparator Vref1 and the second comparator Vref2. Thus, when the load voltage VI is lower than the first threshold voltage Vref1, each of the first comparator 64 and the second comparator 65 outputs a low signal. When the load voltage VI is higher than the first threshold voltage Vref1 and is lower than the second threshold voltage Vref2, the first comparator 64 outputs a high signal and the second comparator 65 outputs a low signal. When the load voltage VI is higher than the second threshold voltage Vref2, each of the first comparator 64 and the second comparator 65 outputs a high signal.

On receiving the low signal from each of the first comparator 64 and the second comparator 65, the address decoder 61 determines that the current value of the load current is small, that is, the address decoder 61 determines that it is in a small current state. On receiving the high signal from the first comparator 64 and the low signal from the second comparator 65, the address decoder 61 determines that the current value of the load current is normal, that is, the address decoder 61 determines that it is in a medium current state. On receiving the high signal from each of the first comparator 64 and the second comparator 65, the address decoder 61 determines that the current value of the load current is large, that is, the address decoder 61 determines that it is in a large current state.

On receiving the high signal from the first AND gate 57 in the small current state, the address decoder 61 outputs the driving signal to one third switching element 59 to couple one set of the high-side second switching element 15 and the high-side resistor 16 with the high-side MOSFET 11. On receiving the high signal from the second AND gate 58 in the small current state, the address decoder 61 outputs the driving signal to one fourth switching element 60 to couple one set of the low-side second switching element 35 and the low-side resistor 36 with the low-side MOSFET 31. As described above, the high-side resistors 16 and the low-side resistors 36 have the same resistance value. Thus, when one high-side resistor 16 or one low-side resistor 36 is coupled in series, the resistance value increases compared with a case where two high-side resistors 16 or two low-side resistors 36 are coupled in parallel. Accordingly, the current values of electric currents that flow into the bypass sections 12, 32 in the small current state can be reduced.

On receiving the high signal from the first AND gate 57 in the medium current state, the address decoder 61 outputs the driving signals to two third switching elements 59 to couple two sets of the high-side second switching element 15 and the high-side resistor 16 in parallel with the high-side MOSFET 11. On receiving the high signal from the second AND gate 58 in the medium current state, the address decoder 61 outputs the driving signal to two fourth switching elements 60 to couple two sets of the low-side second switching element 35 and the low-side resistor 36 in parallel with the low-side MOSFET 31. When two high-side resistors 16 or two low-side resistors 36 are coupled in parallel, the resistance value decreases compared with a case where one high-side resistor 16 or one low-side resistor 36 is coupled in series. Accordingly, the current values of electric currents that flow into the bypass sections 12, 32 in the medium current state can be medium.

On receiving the high signal from the first AND gate 57 in the large current state, the address decoder 61 outputs the driving signals to three third switching elements 59 to couple three sets of the high-side second switching element 15 and the high-side resistor 16 in parallel with the high-side MOSFET 11. On receiving the high signal from the second AND gate 58 in the large current state, the address decoder 61 outputs the driving signal to three fourth switching elements 60 to couple three sets of the low-side second switching element 35 and the low-side resistor 36 in parallel with the low-side MOSFET 31. When three high-side resistors 16 or three low-side resistors 36 are coupled in parallel, the resistance value decreases compared with a case where two high-side resistors 16 or two low-side resistors 36 are coupled in parallel. Accordingly, the current values of electric currents that flow into the bypass sections 12, 32 in the large current state can be increased.

The bypass current is controlled in accordance with the current value of the load current. Accordingly, a decrement of the backflow current can be controlled in accordance with the current value of the load current, and the ringing can be restricted in accordance with the current value of the load current.

While the present disclosure has been described with reference to foregoing embodiments thereof, it is to be understood that the disclosure is not limited to the embodiments and constructions. The present disclosure is intended to cover various modification and equivalent arrangements.

In the first embodiment, the delay circuits 54, 55 delay for a half time of the dead time DT. The delay time is not limited to the half time of the dead time DT and may be any time shorter than the dead time DT.

In the second embodiment, the high-side bypass section 12 includes three sets of the high-side second switching element 15 and the high-side resistor 16 coupled in series between the both ends of the high-side MOSFET 11, and the low-side bypass section 32 includes three sets of the low-side second switching element 35 and the low-side resistor 36 coupled in series between the both ends of the low-side MOSFET 31. The number of the high-side second switching element 15 and the high-side resistor 16 coupled in series between the both ends of the high-side MOSFET 11 and the number of low-side second switching element 35 and the low-side resistor 36 coupled in series between the both ends of the low-side MOSFET 31 are not limited to the above-described embodiments, and may also be, for example, two or four.

In the second embodiment, the address decoder 61 outputs the driving signal to the third switching elements 59 on receiving the high signal from the first AND gate 57, and the address decoder 61 outputs the driving signal to the fourth switching elements 60 on receiving the high signal from the second AND gate 58. Unless the high signals are output from the AND gates 57, 58, the high signals are not input to the second switching elements 15, 35 disposed downstream of the AND gates 57, 58. Thus, the driving signals do not have to be input to the switching elements 59, 60 disposed between the AND gates 57, 58 and the second switching elements 15, 35 only when the AND gates 57, 58 output the high signals. Thus, the output signals of the AND gates 57, 58 do not have to be input to the address decoder 61.

In the second embodiment, the resistors 16, 36 have the same resistance value. The resistors 16, 36 may also have different resistance values. In the present case, in the small current state, the address decoder 61 outputs the driving signals to the switching elements 59, 60 corresponding to the second switching elements 15, 35 coupled in series with the resistors 16, 36 having highest resistance values. In the medium current state, the address decoder 61 outputs the driving signals to the switching elements 59, 60 corresponding to the second switching elements 15, 35 coupled in series with the resistors 16, 36 having medium resistance values. In the large current state, the address decoder 61 outputs the driving signals to the second switching elements 15, 35 coupled in series with the resistors 16, 36 having lowest resistance values.

Figure 10:
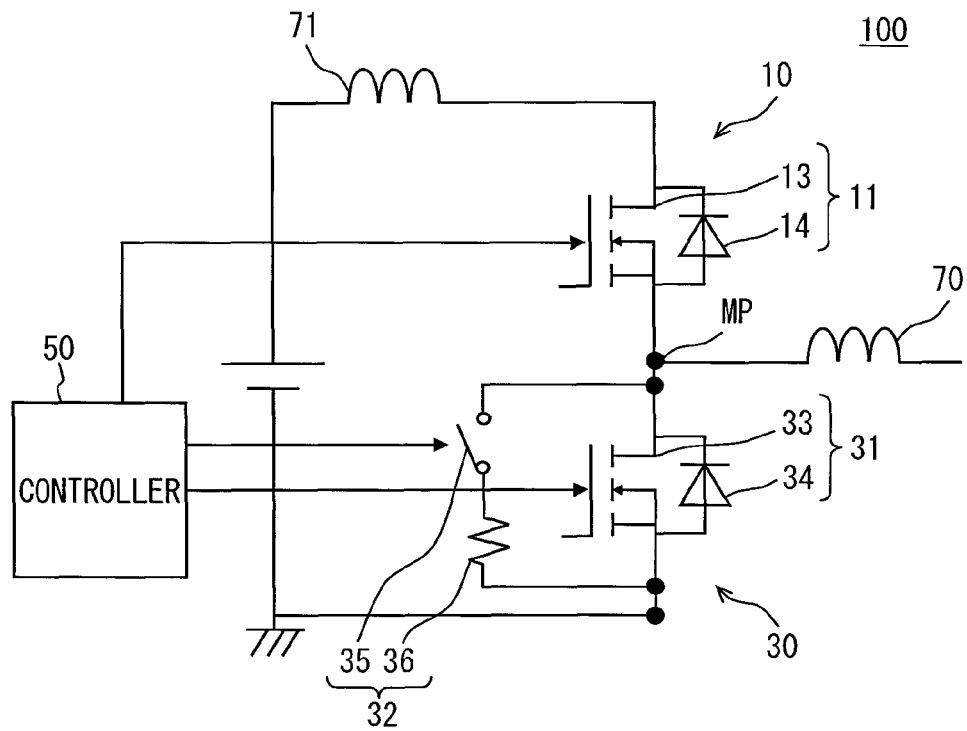
FIG. 10 is a circuit diagram showing an inverter according to a modification.
Figure 11:
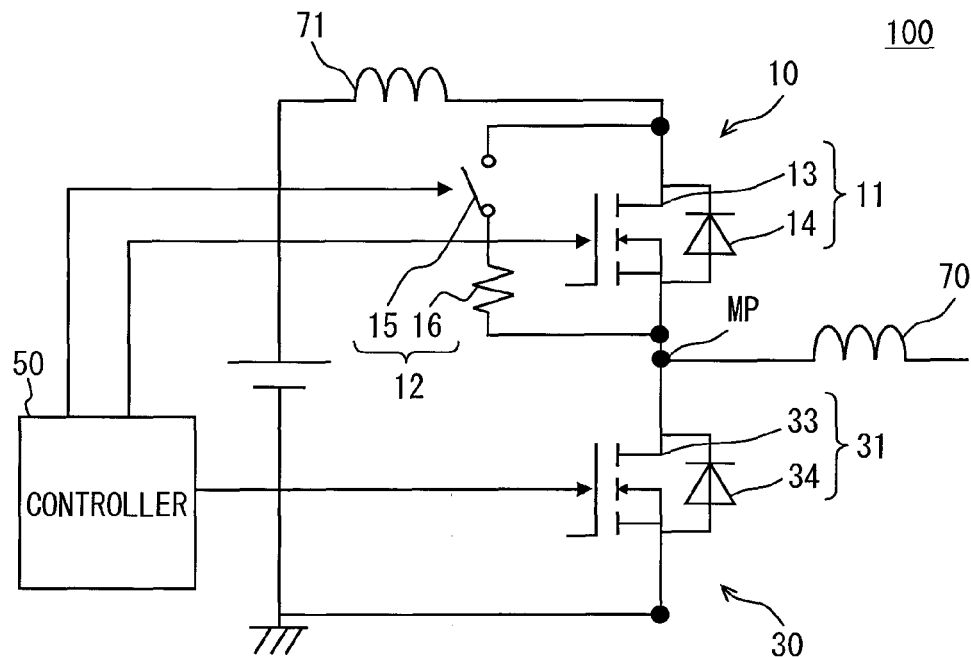
FIG. 11 is a circuit diagram showing an inverter according to another modification.

In each of the above-described embodiments, the high-side unit circuit 10 includes the high-side MOSFET 11 and the high-side bypass section 12, and the low-side unit circuit 30 includes the low-side MOSFET 31 and the low-side bypass section 32. However, in cases where the low-side free wheel diode 34 has a good recovery property, as shown in FIG. 10, a configuration in which the high-side unit circuit 10 includes only the high-side MOSFET 11 may be employed. In contrast, in cases where the high-side free wheel diode 14 has a good recovery property, as shown in FIG. 11, a configuration in which the low-side unit circuit 30 includes only the low-side MOSFET 31 may be employed.

Figure 12:
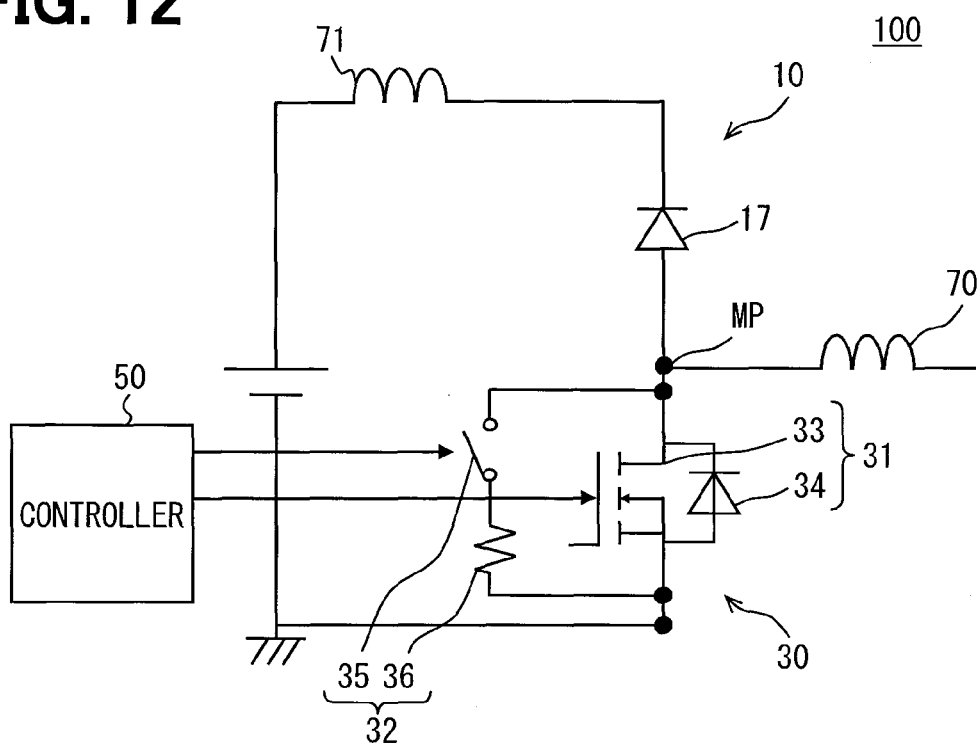
FIG. 12 is a circuit diagram showing an inverter according to another modification.
Figure 13:
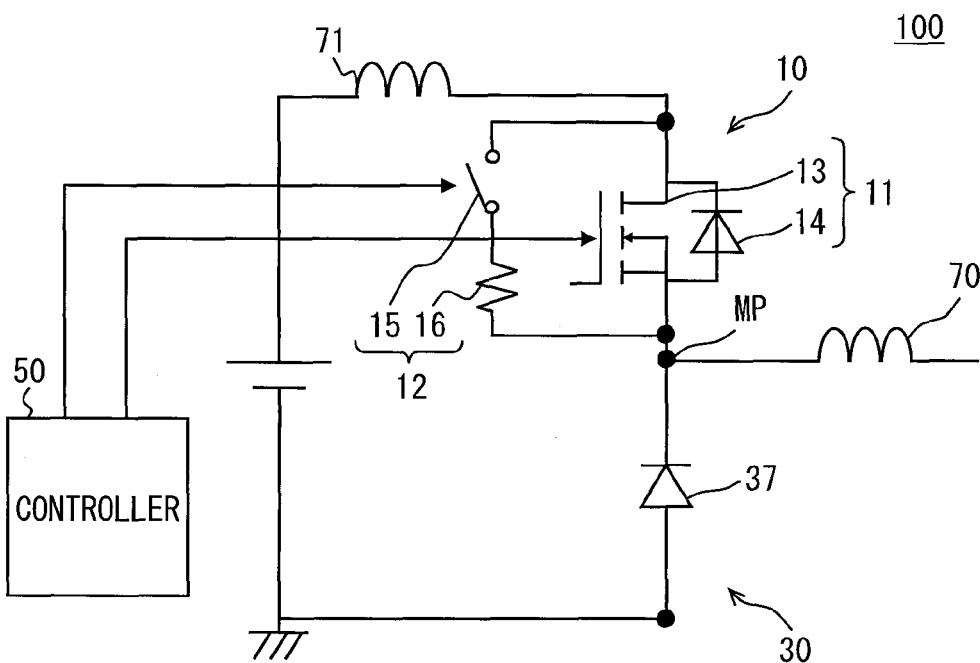
FIG. 13 is a circuit diagram showing an inverter according to another modification.

According to other modifications, semiconductor devices may have configurations shown in FIG. 12 and FIG. 13. In the modification shown in FIG. 12, because electric current does not flow into the low-side free wheel diode 34, a configuration in which the high-side unit circuit 10 includes only a high-side diode 17 may be employed. In contrast, in the modification shown in FIG. 13, because electric current does not flow into the high-side free wheel diode 14, a configuration in which the low-side unit circuit 30 includes only the low-side diode 37 may be employed.

Figure 14:
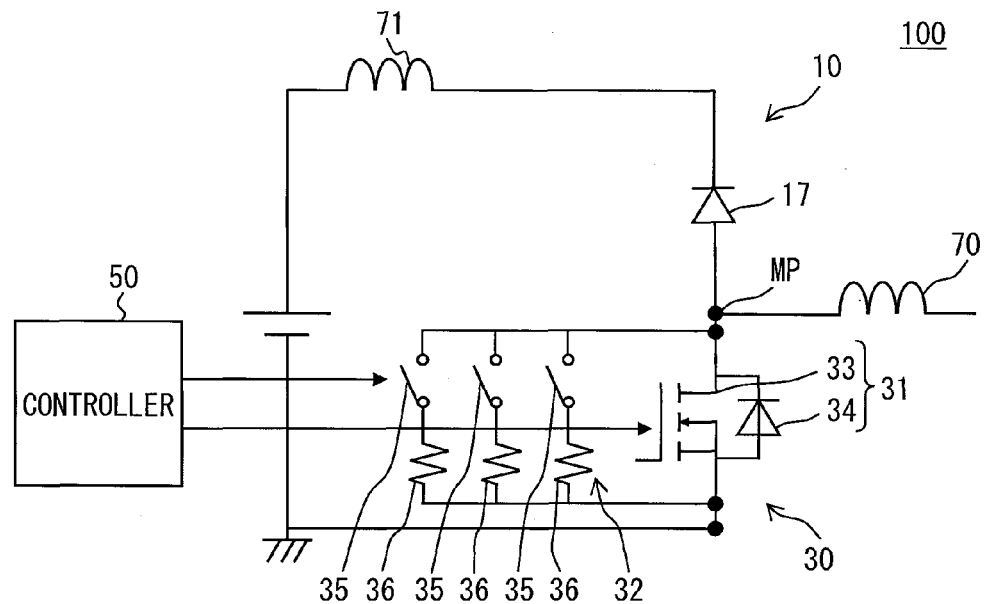
FIG. 14 is a circuit diagram showing an inverter according to another modification.
Figure 15:
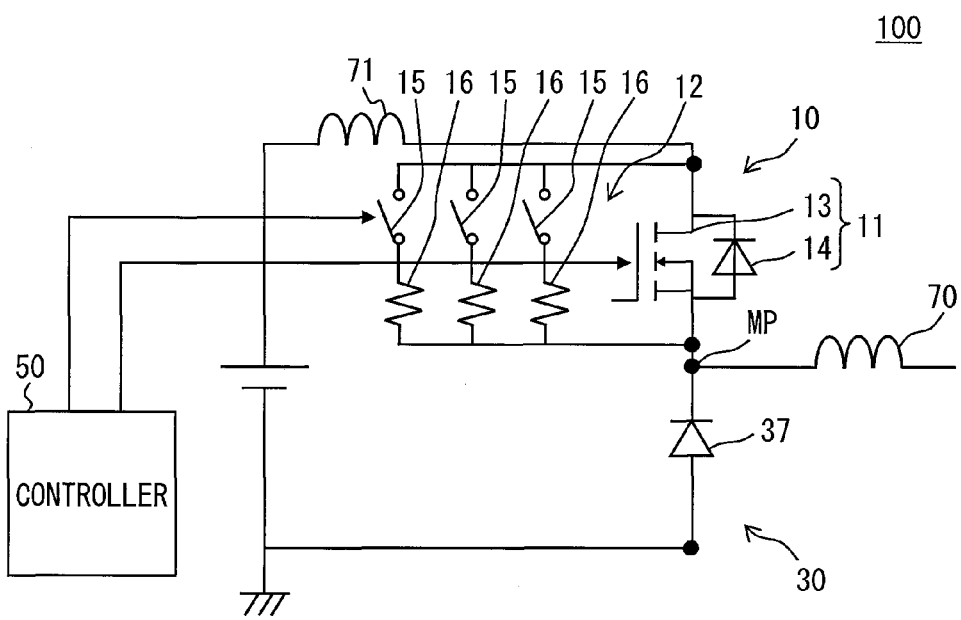
FIG. 15 is a circuit diagram showing an inverter according to another modification.

In the modification shown in FIG. 12, the low-side bypass section 32 includes one low-side second switching element 35 and one low-side resistor 36. The low-side bypass section 32 may also include three sets of low-side second switching element 35 and the low-side resistor 36 coupled in series between the both ends of the low-side MOSFET 31 as shown in FIG. 14. In the modification shown in FIG. 13, the high-side bypass section 12 includes one high-side second switching element 15 and the high-side resistor 16. The high-side bypass section 12 may also include three sets of high-side second switching element 15 and the high-side resistor 16 coupled in series between the both ends of the high-side MOSFET 11 as shown in FIG. 15. In the present case, the controller 50 turns on at least one of the second switching elements 15, 35 based on the load current in a manner similar to the second embodiment. Needless to say, the number of the second switching elements 15, 35 and the number of resistors 16, 36 are not limited to three.

What is claimed is:

1. A semiconductor device comprising:
   a first unit circuit and a second unit circuit coupled in series between a direct current power supply and a ground, a middle point between the first unit circuit and the second unit circuit being coupled with an end of an inductive load, each of the unit circuits including a first switching element and a free wheel diode that is coupled in inverse-parallel with the first switching element, at least one of the unit circuits including a bypass section coupled in parallel with each of the free wheel diode and the first switching element, the bypass section including at least one set of a second switching element and a resistor coupled in series; and
   a controller alternately turning on the first switching element of the first unit circuit and the first switching element of the second unit circuit with a dead time during which both the first switching elements are turned off for a predetermined time, the controller controlling the second switching element coupled in parallel with one of the first switching elements to be an on-state when the one of the first switching elements transitions from an off-state to an on-state in the dead time.

2. The semiconductor device according to claim 1, wherein the first unit circuit and the second unit circuit respectively include the bypass sections.

3. The semiconductor device according to claim 2, wherein each of the first switching elements and the second switching elements becomes the on-state on receiving a signal at a first voltage level and becomes the off-state on receiving a signal at a second voltage level that is different from the first voltage level,
   the controller includes a control signal generator that generates a control signal whose voltage level periodically changes between a first voltage level and a second voltage level, a delay circuit that delays a part of the control signal, and a logic gate that changes a voltage level of an output signal in accordance with a voltage level of an input signal,
   the control signal generated by the control signal generator includes a first control signal, a second control signal whose voltage level is opposite from the first control signal except for the dead time, a third control signal that is at the first voltage level from a falling edge of the second control signal to a rising edge of the first control signal in the dead time, and a fourth control signal that is at the first voltage level from a falling edge of the first control signal to a rising edge of the second control signal in the dead time,
   the delay circuit includes a first delay circuit that delays the third control signal for a time shorter than the dead time and a second delay circuit that delays the fourth control signal for a time shorter than the dead time,
   the logic circuit includes a NOR gate that receives the first control signal and the second control signal, a first AND gate that receives the third control signal via the first delay circuit and an output signal of the NOR gate, and a second AND gate that receives the fourth control signal via the second delay circuit and the output signal of the NOR gate, and
   the first control signal is input to one of the first switching elements, the second control signal is input to the other of the first switching elements, an output signal of the first AND gate is input to the second switching element coupled in parallel with the one of the first switching elements, and an output signal of the second AND gate is input to the second switching element coupled in parallel with the other of the first switching elements.

4. The semiconductor device according to claim 3, wherein each of the bypass sections includes a plural sets of the second switching element and the resistor, and in each of the bypass sections, each set of the second switching element and the resistor is coupled in parallel with the other sets between both ends of the first switching element.

5. The semiconductor device according to claim 4, wherein the controller turns on at least one of the second switching elements based on a current value of an electric current that flows into the inductive load.

6. The semiconductor device according to claim 5, wherein the controller includes a plurality of third switching elements, a plurality of fourth switching elements, an address decoder, a voltage converter, and a plurality of comparators, each of the third switching elements is coupled between the first AND gate and a corresponding one of the second switching elements in the first unit circuit such that the third switching elements are coupled in parallel with each other between the first AND gate and the bypass section in the first unit circuit, each of the fourth switching elements is coupled between the second AND gate and a corresponding one of the second switching elements in the second unit circuit such that the fourth switching elements are coupled in parallel with each other between the second AND gate and the bypass section in the second unit circuit, the address decoder outputs a driving signal to the third switching elements and the fourth switching elements, the voltage converter coverts the electric current that flows into the inductive current into a voltage value in accordance with the current value of the electric current, the comparators have different threshold values and compare the voltage value converted by the voltage converter with the threshold values, and the address decoder selects the third switching elements and the fourth switching elements to which the address decoder outputs the driving signal based on the output signals of the comparators.

7. A semiconductor device comprising:

two unit circuits coupled in series between a direct current power supply and a ground, a middle point between the unit circuits being coupled with an end of an inductive load, one of the unit circuits including a first switching element, a free wheel diode that is coupled in inverse-parallel with the first switching element, and a bypass section coupled in parallel with each of the free wheel diode and the first switching element, the bypass section including at least a set of a second switching element and a resistor coupled in series, the other of the unit circuits including a diode that is reversely coupled between the direct current power supply and the ground, and a controller that controls the second switching element to be an on-state when the first switching element transitions from an off-state to an on-state.

8. The semiconductor device according to claim 7, wherein the bypass sections includes a plural sets of the second switching element and the resistor, and each set of the second switching element and the resistor is coupled in parallel with the other sets between both ends of the first switching element.

9. The semiconductor device according to claim 8, wherein the controller turns on at least one of the second switching elements based on a current value of an electric current that flows into the inductive load.

* * * * *

UNITED STATES PATENT AND TRADEMARK OFFICE
CERTIFICATE OF CORRECTION

PATENT NO. : 8,461,876 B2  
APPLICATION NO. : 13/473826  
DATED : June 11, 2013  
INVENTOR(S) : Atsushi Kobayashi Page 1 of 1

It is certified that error appears in the above-identified patent and that said Letters Patent is hereby corrected as shown below:

Title Page

Correct Item (30), as Foreign Application Priority Data:

Jun. 15, 2011 (JP) ………………. 2011-133585

Feb. 22, 2012 (JP) ………………. 2012-36551

Signed and Sealed this  
Thirtieth Day of July, 2013

Teresa Stanek Rea  
*Acting Director of the United States Patent and Trademark Office*